United States Patent [19]
Zur

[11] Patent Number: 4,950,991
[45] Date of Patent: Aug. 21, 1990

[54] REDUCTION OF TRUNCATION CAUSED ARTIFACTS

[75] Inventor: Yuval Zur, Herzliya, Israel

[73] Assignee: Elscint Ltd., Haifa, Israel

[21] Appl. No.: 359,488

[22] Filed: May 31, 1989

[30] Foreign Application Priority Data

May 31, 1988 [IL] Israel .................................. 86570

[51] Int. Cl.$^5$ ............................................. G01R 33/20
[52] U.S. Cl. ...................................... 324/307; 324/312
[58] Field of Search ............... 324/307, 311, 312, 309;
375/104; 364/413, 13, 574, 724, 726

[56] References Cited

U.S. PATENT DOCUMENTS

| | | | |
|---|---|---|---|
| 4,300,096 | 11/1981 | Harrison et al. | 324/309 |
| 4,535,460 | 8/1985 | Wedel, Jr. | 375/104 |
| 4,614,907 | 9/1986 | Nagayama | 324/312 |
| 4,780,675 | 10/1988 | DeMeester et al. | 324/312 |

OTHER PUBLICATIONS

R. Bracewell, "The Fourier Transform and its Application", McGraw-Hill Book Co. (1965), pp. 209–211.

Primary Examiner—Hezron E. Williams
Assistant Examiner—Kevin D. O'Shea
Attorney, Agent, or Firm—Sandler, Greenblum & Bernstein

[57] ABSTRACT

The Gibb's artifact in magnetic resonance images is reduced by asymmetrically sampling acquired F.I.D. signals to obtain data, time domain filtering the obtained data with a filter that reduces overshoot, degrades resolution but increases SNR. Then obtaining symmetrical data by complex conjugating the time domain filtered data which improves the resolution, compresses the overshoot, but decreases SNR. Processing the symmetrical data to obtain images with insignificant Gibb's artifacts.

14 Claims, 2 Drawing Sheets

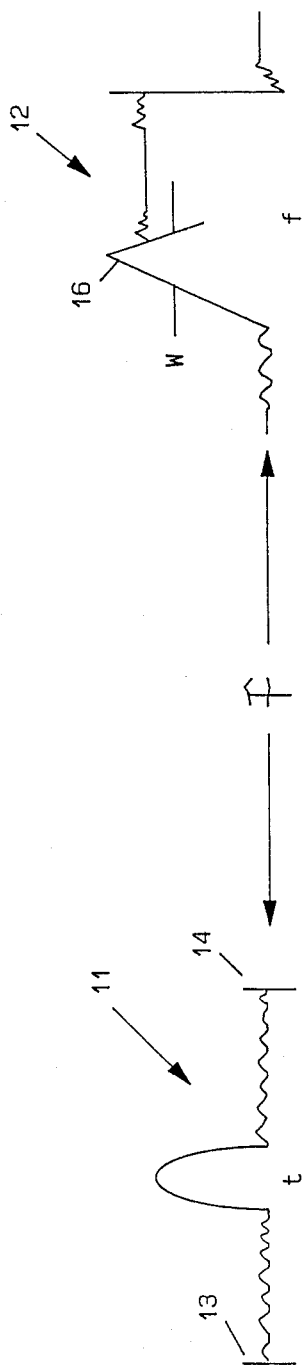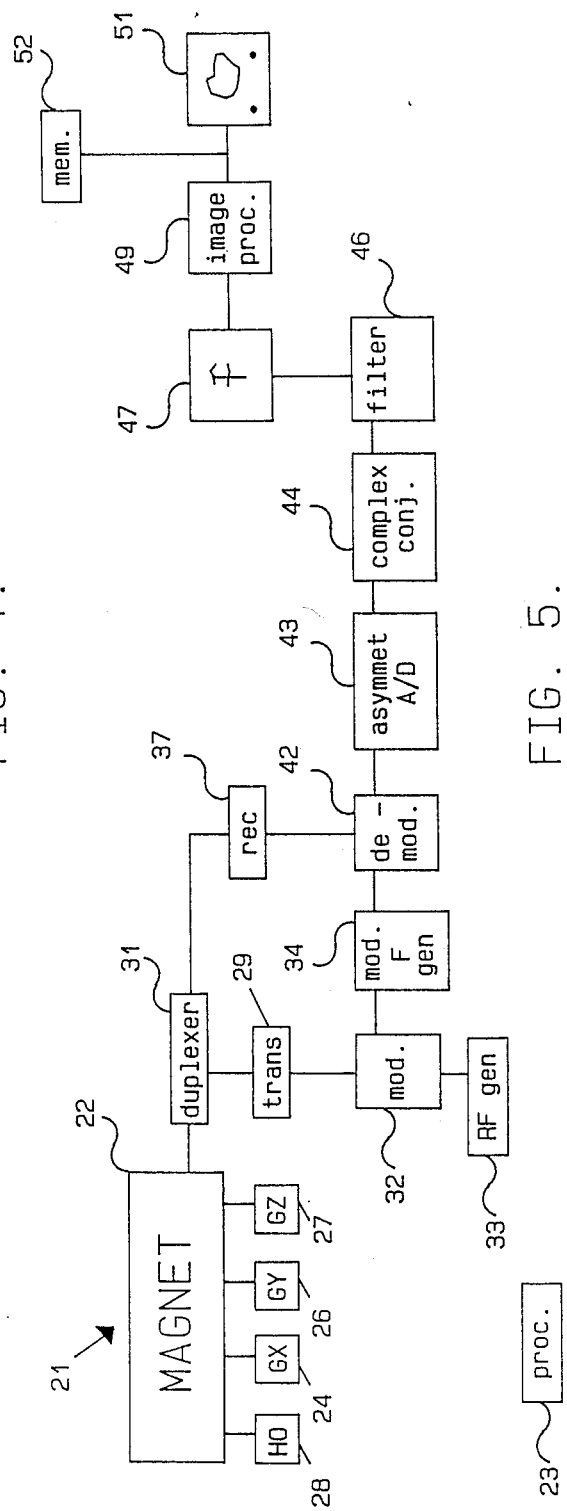
FIG. 1.
FIG. 5.

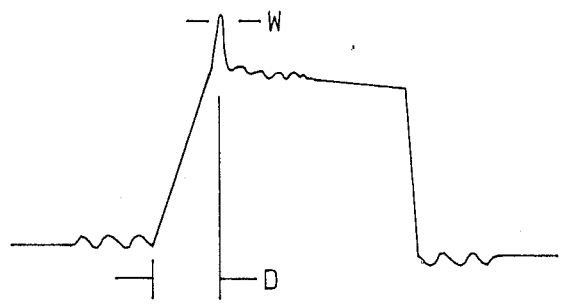
FIG. 2.
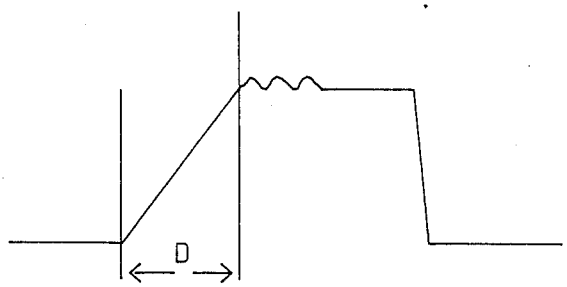
FIG. 3.
FIG. 4.
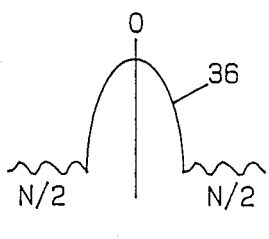 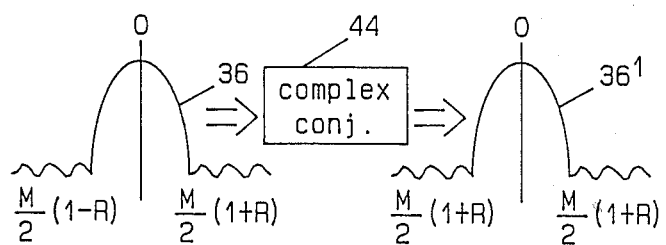
FIG. 6(a).    FIG. 6(b)    FIG. 6(c)

REDUCTION OF TRUNCATION CAUSED ARTIFACTS

FIELD OF THE INVENTION

This invention is concerned with the magnetic resonance imaging (MRI) and more particularly with the minimization of Gibbs artifacts in images obtained using MRI systems.

BACKGROUND OF THE INVENTION

Sampling is time limited. The finite sampling time results in artifacts caused by what is known as "the Gibbs Phenomenon". The representation in the image domain near a discontinuity, for example, includes an "oscillatory overshoot" which is approximately 9% of the magnitude of the signal at the discontinuity. An artifact due to the Gibbs phenomen appears as "ringing" in the image. The ringing is often referred to as "Gibbs artifact". See the book entitled "The Fourier Transform and its Applictions" by R. Bracewell, published by McGraw-Hill Book Co. (1965) pp. 209 et seq.

If more sampling points are taken, the amplitude remains 9%, but the overshoot is compressed towards the edge of the discontinuity which reduces the artifact and accordingly improves the spatial resolution. While taking more sampling points improves spatial resoltion, it requires time which reduces throughput. Also, as is well known, the signal-to-noise ratio (SNR) is proportional to the inverse of the square root of N where N is the number of sampling points. Accordingly, to obtain enough sampling points to effectively reduce the Gibbs artifact not only reduces throughput, but also reduces the SNR of the image to the point where the improved resolution may be obscured by noise.

A multiplicative filter in the time domain can effectively reduce the overshoot and increase the SNR. However, such a filter reduces the resolution of the image. The reduction in resolution occurs because a time domain filter that reduces the overshoot also increases the transition width of the function. The spatial resolution; i.e. the smallest size detectable, is proportional to the transition width; so that, an increased transition width means the smallest size detectable increases.

In magnetic resonance imaging there are many instances, for example, for thoracic images when an image of 256×256 is not required. In fact many times an image providing less resolution, but improved SNR and acquisition time would be preferred. Until now the lower resolution images have not been used because of the Gibbs artifact, which obscures the image and especially an image with less resolution. Therefore, what is required is a reduction of the Gibbs artifact without adversely effecting the resolution, the SNR or the scan time.

Accordingly, it is an object of the present invention to effectively and substantially reduce the ringing artifact in the display image while substantially maintaining a given resolution and the signal-to-noise ratio of the final display image without increasing the scan time.

BRIEF DESCRIPTION OF THE INVENTION

According to the present invention a method of reducing ringing artifacts is provided; the method accomplishes the scan without increasing the scan time while reducing the ringing artifacts and maintaining the signal-to-noise ratio and the resolution obtained by previously used imaging methods, said method comprising the steps of:

(a) acquiring free-induction decay (FID) signals;

(b) asymmetrically sampling the acquired signals to obtain data;

(c) multiplying the obtained data by an optimized filter in the time domain to provide time domain filtered data, which:
  (1) reduces the overshoot,
  (2) degrades the resolution, and
  (3) increases the SNR, (d) obtaining symmetrical data by complex conjugating the time domain filtered data which:
  (1) increases the amount of data and consequently improves the resolution.
  (2) compresses overshoot causing the ringing artifact; and
  (3) decreases the signal-to-noise ratio (SNR);

(e) Fourier transforming the symmetrical data to obtain the image data; and (f) processing the image data to obtain an image with substantially no ringing artifact and with resolution and signal-to-noise ratio comparable to images obtained using symmetrical sampling.

As used herein FID signals may includes echo signals. Also it should be understood that the filtering can occur after the complex conjugation step (of the acquired data) or that the Fourier transforming step can occur before the complex conjugating step within the scope of the invention. In addition, while invention can be applied in either the phase encoding or frequency encoding direction maximum benefits (time saving) occur when the invention is applied in the phase encoding direction.

BRIEF DESCRIPTION OF THE DRAWINGS

The above mentioned and other features and objects of the present invention will be best undertood when considered in the light of the following description of a broad aspect of the present invention taken in conjunction with the accompanying drawings, wherein:

FIG. 1 illustrates Gibbs overshoot in a frequency signal obtained from a Fourier transformed truncated time signal;

FIG. 2 illustrates the Gibbs overshoot in the frequency signal obtained from the Fourier transformed and truncated time signal when more sampling points are used than were used in FIG. 1;

FIG. 3 shows the Gibbs overshoot in a frequency signal obtained from a Fourier transformed multiplicatively filtered time signal;

FIG. 4 illustrates a preferred type of filter for use in the inventive system.

FIG. 5 shows an MRI system and components for carrying out the inventive Gibbs artifact reduction, and FIG. 6 illustrates at:
(a) prior art symmetrical sampling,
(b) asymmetrical sampling, and
(c) asymmetrically sampled data after complex conjugation.

GENERAL DESCRIPTION

In FIG. 1, the drawing shows a typical FID signal 11 acquired in the time domain. As indicated by the stylized "F", the time domain signal which in a preferred embodiment is an echo signal, is Fourier transformed into the frequency domain signal 12. Note that the time domain signal does not go from minus infinity to plus infinity, but instead is truncated as indicated by lines 13 and 14 defining the limites of the time domain signal 11. The truncation of the time domain signal results in the Gibbs effect overshoot 16 that appears in the frequency domain signal 12. This overshoot causes the Gibbs artifact; i.e., a blurring or ringing artifact to appear in the image.

FIG. 2 shows the effect on the Gibb's overshoot of sampling a greatly increased number of points. Sampling the greatly increased number of points, narrows or compresses the frequency displacement of the overshoot. This reduces the ringing artifact effect of the overshoot. However, the throughout time and the signal-to-noise ratio suffer due to the increased number of sampling points even though the image resolution improves. In the prior art the Gibbs effect precluded acquiring images with fewer sampling points because of the resulting disasterous ringing artifacts which obscured the images.

FIG. 3 shows the effect on the Fourier transformed signal of a time domain spatial filter. Here note that the signal 17 has a sharply reduced Gibbs overshoot 18. However, the line 19 which defines the edge of the signal is now biased rather than being substantially perpendicular. In actual practice the line 19 is transformed from having a transitional width D of one pixel to having a transitional width D much larger than the one pixel. In a preferred embodiment, the transitional width D may vary up to three times the original one pixel width. It is apparent from FIG. 3 that since the transitional width is greatly increased over the transitional with of FIG. 2, for example, the size of smallest detail that can be discerned; i.e., the resolution (in pixels or mm) will increase responsive to the use of the filter. The resolution is a direct function of the transitional width.

The filter is shown in FIG. 4 as a window 20. While a Kaiser type window is shown it should be understood that other functions could be used. An important characteristic is that substantially only the center of the acquired data passes through the window and the overshoot is attenuated.

The magnetic resonance imaging (MRI) system 21 shown in FIG. 5 is equipped to minimize or reduce significantly the Gibbs artifact without any significant adverse effects on SNR, resolution or imaging time. The MRI system 21 comprises the usual magnet 22 used to provide the large static magnetic field that aligns the "spins" in the patient placed within the bore of the magnet.

The magnet and system and under the control of the control processor shown at 23. The control processor is not shown attached to the component parts of the MRI system 21 to avoid a plethora of lines in the drawing that would add more confusion than enlightenment. It is understood and well known that the control-processor 23 provides the timing and control signals for the MRI system 21.

Associated with large static magnet are gradient field generators shown for generating X, Y, and Z gradient fields used for locating the sources of the received signals. In greater detail the X gradient field generator Gx is shown at 24, the Y gradient field generator Gy is shown at 26 and the Z gradient field generator Gz is shown at 27. The large static magnetic field generator Ho is shown at 28.

Means are provided for perturbing (i.e. "tipping") the spins aligned by the large static magnetic field. More particularly a radio frequency (RF) coil (not shown) is located within the large magnet 22. In the transmitting mode a transmitter 29 applies RF pulses through a duplexer circuit 31 to the RF coil. The transmitter 29 receives the pulses through a modulator 32. The modulator may be used to modulate a radio frequency from a radio frequency generator 33 with a modulating signal from the modulating generator 34 to shape the RF pulse. The RF pulse applied to the RF coil of the magnet system tips the spins first through 90 degrees and subsequently through 180 degrees in a regular spin echo sequence, for example.

During the application of the RF pulses, a slice selecting gradient pulse Gz is applied. Subsequently, a phase encoding pulse Gy is applied. During the receipt of a signal, a read or view gradient pulse Gz is applied.

In the receive cycle, the echo is received as indicated by signals shown at 36 in FIG. 6(b). The signal 36 is an asymmetrically sampled signal. The receipt of the signal occurs during the application of read gradient pulse 39.

The distinction between a normal or symmetrically sampled received signal and an asymmetrically sampled signal is best shown by comparing FIGS. 6(a) and 6(b). FIG. 6(a) shows the signal 36 as normally sampled. Therein the same number of samples (M/2) are taken on each side of the peak of the received signal. Thus, if M is 128, for example, 64 samples are taken on each side of the center of the signal peak, along the O ordinate.

FIG. 6(b) shows an example of asymmetric sampling. Therein $(M/2)(1+R)$ samples are shown as being taken on one side of the center of the signal. The other side of the center of the signal provides $(M/2)(1-R)$ samples where $R < 1$ and is positive. Thus, if $R = 0.3$, for example, and M is 128, then one side provides $64 \times 1.3$ or 83 samples and the other side provides $64 \times 0.7$ or 45 samples. Further, as shown in FIG. 6(c) after complex conjugation, the number of samples totals 166 which of course increases the resolution and reduces the SNR without effecting the scan time.

Returning to the explanation of FIG. 5, the received signal is demodulated in the demodulator 32 which receives both the received signal and a signal from the modulating generator 34. The signal from the demodulator is converted into digital signals by analog to digital converter 43. The asymmetric sampling is generally done in one direction. It could be done in either the time or in the phase encoding directions. More time is saved if the eccentric sampling is done in the phase encoding direction.

The complete acquired data, for example, comprises data in a $128 \times 128$ matrix obtained by acquiring and digitizing signal 36. Complex congjugation is used to generate data for a $128 \times 166$ matrix, for example. The complex conjugator is shown as unit 44. The output of the complex conjugator is sent through a multiplicative filter, such as a Kaiser filter 46 to aid in the removal of the Gibbs artifacts. The output of the Kaiser filter is Fourier transformed by Fourier transform operator 47.

In practice the Fourier transforming and/or the filtering can be accomplished prior to complex conjugation within the scope of this invention. Further, in practice the filter parameters are selected to optimize the reduction of the Gibbs artifact and to retain substanitally the same resolution, SNR (and scan time) by also taking into account the improvement to resolution and the impairment of SNR caused by the complex conjugation step.

The resolution obtained by the inventive imaging, that is, for example, by the asymmetric sampling, multiplicative filtering, and complex conjugation as compared to the resolution with symmetrical sampling obtained using the same number of sampling points is given by:

$$RES = \frac{D}{(1 + R)}$$

where:

D is the transition width (in pixels or mm) after multiplicative filtering (see FIG. 3), and R is the sampling asymmetry (see FIG. 6).

Before filtering the transition width is one pixel. In symmetrical sampling as opposed to asymmetrical sampling, R is zero. In practice the number of sampling points is N without complex conjugation. After complex conjugation there are 2M sampling points where $2M=N(1+R)$ and $N<2M$. Note that the filter degrades the resolution, but the complex conjugation improves the resolution. Consequently, the resolution does not change significantly during the processing which reduces the Gibbs artifact.

The SNR obtained by the unique imaging described herein compared to the SNR normally obtained is given by:

$$SNR = \left(\frac{1}{1 + 3R}\right)^{\frac{1}{2}} * \frac{1}{\sigma_F}$$

where:

R is the selected sampling asymmetry, which is chosen to effect the best compromise, and $\sigma_F$ is the RMS noise reduction due to the multiplicative filter.

With symmetric sampling R is zero and the SNR is one. Therefore, the asymmetric sampling degrades the SNR. The filter on the other hand improves the SNR. Consequently, the SNR does not change significantly during the processing to reduce the Gibbs artifact.

Assume 2M points are sampled after conjugation. The filter multiplies every point by filter function fk; where: $-M \leq k \leq M$ and the point $f_k=o$ is normalized to 1. Then:

$$\sigma_F^2 = \frac{1}{2M} \sum_{k=-M}^{M} f(k)^2$$

As an example where the Kaiser filter is applied (see the book entitled "Digital Filters", 2nd ed. by R. W. Hamming, published by Prentice Hall Inc. (1983):

$$(fk) = \frac{Io[\alpha \sqrt{1 - (k/M)^2}]}{Io(\alpha)}$$

where:

Io is a function given by $$Io(x) = 1 + \sum_{n=1}^{\infty}\left[\frac{(x/2)^n}{n!}\right]^2$$

$\alpha$ is a free parameter of the filter, the other parameters can be computed once $\alpha$ is selected; for a Kaiser filter:

$\alpha = 0.5842 (A - 21)^{0.4} + 0.07886(A-21)$ for $20 < A < 50$,

A is the filter attenuation of the Gibbs overshoot in decidbels, $$D = \begin{cases} \frac{A - 7.95}{14.36} & A > 21 \\ 0.9222 & A < 21 \end{cases}$$

$n = 1,2,3 \ldots$

By determining $\alpha$, D, A $\sigma_F$ from the filter selected, the following type of table can be generated:

TABLE I

| Attenuation Adb | Alpha $\alpha$ | Sigma $\sigma_F$ | Transition Width D |
|---|---|---|---|
| 22 | 0.663 | 0.966 | 0.978 |
| 23 | 0.929 | 0.938 | 1.048 |
| 24 | 1.143 | 0.913 | 1.118 |
| 25 | 1.333 | 0.890 | 1.187 |
| 26 | 1.506 | 0.869 | 1.257 |
| 27 | 1.669 | 0.850 | 1.327 |
| 28 | 1.821 | 0.832 | 1.396 |
| 29 | 1.973 | 0.816 | 1.466 |
| 30 | 2.117 | 0.802 | 1.536 |
| 31 | 2.256 | 0.788 | 1.605 |

By way of example, if the overshoot is to be attenuated by 6db (which means A=27db) then $\alpha=1.669$, $\sigma_F$ is 0.850 and D=1.327.

In our example with R=0.3, the resolution would then be 1.327/1.3 or approximately 1 and the comparative SNR would then be $[1/1.9]^{\frac{1}{2}}[1/0.850]$ or 0.8535

Thus, a Kaiser filter would cut the overshoot in half, while substantially maintaining the resolution and the SNR.

Attenuating the overshoot by 10 db, which means that A=31, $\alpha=2.256$, $\sigma_F=0.788$ and D=1.605 would provide a comparative resolution of 1.24 and a comparative SNR of 0.9207—a slightly decreased comparative resolution and a better comparative SNR. In addition, the asymmetry can be selectively varied to add to the control of the resolution and the SNR. The following table shows sample variations in the comparative resolution and SNR obtainable by selecting the R to be 0.30, 0.33 or 0.27 and the attenuation to be 27 or 31 db:

TABLE II

| R Asymmetry | Adb Attenuation | Comparative Resolution RES | Comparative SNR |
|---|---|---|---|
| 0.30 | 27 | 1.021 | 0.8536 |
| 0.33 | 27 | 0.9557 | 0.8340 |
| 0.27 | 27 | 1.045 | 0.8745 |
| 0.30 | 31 | 1.24 | 0.9207 |
| 0.33 | 31 | 1.206 | 0.8996 |
| 0.27 | 31 | 1.264 | 0.9432 |

Thus, the parameters of the filter can be chosen to effect a compromise between the resolution, the ringing artifact and the SNR all without taking additional scan time. Ideally the parameters are chosen so that the degradation of neither the resolution nor the SNR are significant while the Gibbs artifact is substantially reduced and the scan time remains the same.

It should be understood that in the prior art even when the resolution is maximized, where the Gibbs artifact prevails, then the artifact often prevents proper diagnoses through the use of the image. Lesions, for example, are often too badly "smeared" to be discernible.

Thus methods and equipment are provided for minimizing the Gibbs artifact without having to pay with added scan time, worse resolution or lower SNR.

While the invention has been described using specific embodiments, it should be understood that these embodiments are described by way of example only and should not be interpreted as limitations on the scope of the invention which is defined by thhe accompanying claims.

What is claimed is:

1. A method fo reducing Gibbs artifacts in images acquired using magnetic resonance imaging (MRI) systems, said method comprising the steps of:
    (a) acquiring MRI signals,
    (b) sampling the acquired signals to obtain data,
    (c) increasing the amount of data to improve the resolution, compress overshoot causing Gibbs artifacts but decrease the signal-to-noise ratio (SNR) of the subsequent image,
    (d) operating on the increased data to decrease the overshoot,
    (e) processing the increased data with decreased overshoot to obtain the subsequent images with very little Gibbs artifact and with resolution and SNR comparable to images obtained through normal operations.

2. The method of reducing Gibbs artifacts of claim 1 wherein the step of sampling the acquired signals to obtain data comprises asymmetrically sampling the acquired signals to obtain data.

3. The method of claim 2 wherein said step of increasing the amount of data comprises complex conjugating the data obtained by asymmetrically sampling the acquired signals.

4. The method of claim 3 wherein the step of operating on the increased data to decrease the overshoot comprises multiplying the increased data obtained using the complex conjugation by an optimized filter.

5. The method of claim 4 wherein the step of processing the increased data with the decreased overshoot includes the step of Fourier transforming the data obtained from the filter to obtain image data.

6. The method of claim 4 wherein the step of multiplying the increased data obtained using the complex conjugation by an optimized filter comprises ultilizing a Kaiser filter.

7. The method of claim 3 including the step of multiplying data acquired by the asymmetrically sampling step by an optimized filter to obtain filtered data, complex conjugating the filtered data, and Fourier transforming the complex conjugated filter data to obtain image data.

8. A system for reducing Gibbs artifacts in images acquired using magnetic resonance imaging (MRI) systems, said system comprising:
    (a) means for acquiring MRI signals,
    (b) means for sampling the acquired signals to obtain data,
    (c) means for increasing the amount of data to improve the resolution, compress overshoot causing Gibbs artifacts, but decrease signal-to-noise ratio (SNR) of a subsequent image,
    (d) means for operating on the increased data to decrease the overshoot,
    (e) means for processing the increased data with decreased overshoot to obtain the subsequent images with very little Gibbs artifact and with resolution and SNR comparable to images obtained through normal operations.

9. The system for reducing Gibbs artifacts of claim 8 wherein the means for sampling the acquired signals to obtain data comprises means for asymmetrically sampling the acquired signals to obtain data.

10. The system of claim 9 wherein the means for increasing the amount of data comprises means for complex conjugating the data obtained by asymmetrically sampling the acquired signals.

11. The system of claim 10 wherein the means for operating on the increased data to decrease the overshoot comprises means for multiplying the increased data obtained using the complex conjugation by an optimized filter.

12. The system of claim 11 wherein the means for processing the increased data with the decreased overshoot includes means for Fourier transforming the data obtained from the filter to obtain image data.

13. The system of claim 11 wherein the means multiplying the increased data obtained using the complex conjugating by an optimized filter comprises a Kaiser filter.

14. The system of claim 9, including means for multiplying the data acquired by the means for asymmertrically sampling data by an optimized filter to provide filtered data, means for complex conjugating the filtered data and means for Fourier transforming the complex conjugated filtered data to provid image data.

* * * * *